United States Patent
Iancu et al.

(10) Patent No.: US 7,370,258 B2
(45) Date of Patent: May 6, 2008

(54) ITERATIVE CONCATENATED CONVOLUTIONAL REED-SOLOMON DECODING METHOD

(75) Inventors: Daniel Iancu, Pleasantville, NY (US); Hua Ye, Durham, NC (US); John Glossner, Carmel, NY (US)

(73) Assignee: Sandbridge Technologies Inc., White Plains, NY (US)

( * ) Notice: Subject to any disclaimer, the term of this patent is extended or adjusted under 35 U.S.C. 154(b) by 534 days.

(21) Appl. No.: 11/116,340

(22) Filed: Apr. 28, 2005

(65) Prior Publication Data

US 2006/0248430 A1    Nov. 2, 2006

(51) Int. Cl.
*H03M 13/29* (2006.01)
(52) U.S. Cl. .................................................. 714/755
(58) Field of Classification Search ................. 714/755
See application file for complete search history.

(56) References Cited

U.S. PATENT DOCUMENTS

| | | | |
|---|---|---|---|
| 4,763,332 A | | 8/1988 | Glover |
| 5,606,569 A | * | 2/1997 | MacDonald et al. ......... 714/758 |
| 5,684,810 A | * | 11/1997 | Nakamura et al. .......... 714/755 |
| 5,712,861 A | * | 1/1998 | Inoue et al. ................. 714/752 |
| 5,996,103 A | * | 11/1999 | Jahanghir ................... 714/755 |
| 6,065,149 A | | 5/2000 | Yamanaka |
| 6,081,919 A | | 6/2000 | Fujiwara et al. |
| 6,263,470 B1 | | 7/2001 | Hung et al. |
| 6,327,690 B1 | | 12/2001 | Zhang et al. |
| 6,360,348 B1 | | 3/2002 | Yang |
| 6,385,751 B1 | | 5/2002 | Wolf |
| 6,511,280 B1 | * | 1/2003 | Sammartino et al. ....... 414/784 |
| 6,571,368 B1 | | 5/2003 | Chen |
| 6,574,772 B1 | | 6/2003 | Chou |
| 6,634,007 B1 | * | 10/2003 | Koetter et al. .............. 714/784 |
| 6,691,263 B2 | | 2/2004 | Vasic et al. |
| 6,757,117 B1 | | 6/2004 | Livingston |
| 6,791,995 B1 | | 9/2004 | Azenkot et al. |

OTHER PUBLICATIONS

Bate, S., et al., "Error control techniques applicable to HF channels", IEE Proceedings, vol. 136, Pt. 1, No. 1, Feb. 1989, pp. 57-63.*
Paaske, E., "Improved Decoding for a Concatenated Coding System Recommended by CCSDS", IEEE transactions on Communications, vol. 38, No. 8, Aug. 1990, pp. 1138-1144.*

* cited by examiner

*Primary Examiner*—Stephen M. Baker
(74) *Attorney, Agent, or Firm*—Barnes & Thornburg LLP

(57) ABSTRACT

A method and apparatus for decoding a coded data stream of bits using an inner decoder, deinterleaver and an outer decoder. The outer decoder first decodes by error correction decoding for r errors per word. The decoding is terminated and a decoded word is outputted if the syndromes of the corrected word of the first decoding are all zeros. If the syndromes of the corrected word of the first decoding are not all zeros, a second decoding is performed by error decoding and erasure for the number of errors reduced by one and the number of erasures increased to two. The decoding is terminated and a decoded word is outputted if the syndromes of the corrected word of the second decoding are all zeros. If the syndromes of the corrected word of the second decoding are not all zeros, the second decoding by correcting and erasure decoding is repeated for the number of errors reduced by one and the number of erasures increased by two for each iteration of the second decoding.

19 Claims, 2 Drawing Sheets

ITERATIVE CONCATENATED CONVOLUTIONAL REED-SOLOMON DECODING METHOD

BACKGROUND AND SUMMARY OF THE DISCLOSURE

The present disclosure relates generally to polynomial-generated error-correcting encoding and decoding and, more specifically, to Reed-Solomon (RS) error detection and correction techniques for example concatenated convolutional RS decoding.

Reed-Solomon coding and decoding schemes are used in many communication systems, such as satellites, modems, audio compact discs and wireless telephones. Each communication system has a different set of values for the parameters which define the Reed-Solomon code. Reed-Solomon encoders/decoders use Galois Field (GF) arithmetic to map blocks of communication into larger blocks.

As implemented in hardware, the Reed-Solomon encoder/decoder requires a substantial number of logic gates and other hardware. Many efforts have been directed to reducing the amount of hardware by, for example, parallel processing and reducing the arithmetic representation of the processes. Reed-Solomon decoders, specific to various communication systems, have been implemented in dedicated hardware blocks because of the computational complexity and low power requirements. See, for example, R. E. Blahut's "Theory and practice of error control codes," Addison-Wesley, 1984; and S. B. Wicker's "Error control systems for digital communication and storage," Prentice Hall, Inc., 1995.

One example of an error correction device for a communications system using the Reed-Solomon code is U.S. Pat. No. 6,065,149. The error correction device is provided with an internal code decoder which outputs a series of decoded data and reliability information of the decoded data, a CRC (Cyclic Redundancy Check) decoder, a de-interleaver, an erasure position detector, and an external code decoder for decoding an external code by soft judgment. When the external code is decoded by the soft judgment, not only the series of decoded data of the internal code and their reliability information, but also the frame error information based on CRC are used as input signals. In example described in the patent, one symbol in the Reed-Solomon code is constituted by 8-bits and therefore the Galois field is 256. After CRC decoding, the erasure position detector determines if 8-bits have been erased in 40 symbols. If so, it controls the external code decoder so as to correct the erasure of the 8 symbols. If no frame error is detected by the CRC decoder, the erasure position detector controls the external decoder to perform 4 symbol error correction. Thus, the system either performs corrections of the erasures for 8 symbols or performs 4 symbol error correction based on the results of the CRC decoder.

A similar system for coding and decoding symbols using CRC check bit of a Reed-Solomon code is described in U.S. Pat. No. 6,081,919. The decoding apparatus includes error detection using the CRC check bits performed after decoding of the inner decode. After symbol deinterleaving is performed, decoding of the outer code by erasure decoding or error detection is performed depending upon the number of symbols included in a frame in which an error has been detected. If the number of symbols in a frame after deinterleaving in which errors have been detected is not larger than the number of symbols which can be corrected by the erasure decoding, the decoding of the outer code is done by erasure decoding. If the number of symbols in the frame after deinterleaving which have detected errors is larger than the number of symbols which can be corrected by the erasure decoding, than the outer code is decoded by error correction. As in the previous patent, this is a system that performs either erasure decoding or error correction decoding.

The present system is a method and apparatus for decoding an encoded data stream of bits using an inner decoder, deinterleaver and an outer decoder. The outer decoder first decodes by error correction decoding for r errors per word. The decoding is terminated and a decoded word is outputted if the syndromes of the corrected word of the first decoding are all zeros. If the syndromes of the corrected word of the first decoding are not all zeros, a second decoding is performed by error correcting and erasure decoding for the number of errors r reduced by one and the number of erasures increased by two. The decoding is terminated and a decoded word is outputted if the syndromes of the corrected word of the second decoding are all zeros. If the syndromes of the corrected word of the second decoding are not all zeros, the second decoding by error correcting and erasure decoding is repeated for the number of errors reduced by one and the number of erasures increased by two for each iteration of the second decoding.

Also, a method and apparatus of decoding includes an inner coder, a deinterleaver and an outer decoder wherein the outer decoder first decodes by error correction for r error per word. The decoding is terminated and a decoded word is outputted if the syndromes of the corrected word of the first decoding are all zeros. If the syndromes of the corrected word of the first decoding are not all zeros, the error r is reduced by one and the number of erasures is increased by two. An error locator polynomial is derived and the degree of the error located polynomial is compared to the decreased number of errors if the syndromes of the corrected word of the first decoding are not all zeros. If the degree of the error locator is greater than the decreased number of errors, the number of errors are decreased by one and the number of erasures are increased by two and the deriving and comparing steps are repeated. If the degree of the error locator is equal to or less than the decreased number of errors, the second decoding by error correcting and erasure decoding is performed.

These and other aspects of the present disclosure will become apparent from the following detailed description of the disclosure, when considered in conjunction with accompanying drawings.

DETAILED DESCRIPTION OF THE DRAWINGS

The present method is an iterative decoding algorithm for the Concatenated Convolutional Reed-Solomon encoders. The entire decoding algorithm is executed in software in an iterative fashion. The decoding process-starts assuming the received word has at most t errors, where 2t+1 is the code minimum distance. If, after the decoding process, all the syndromes are zero, the decoding is successful, otherwise most probable more than t errors are encountered. At this point the decoder will assume s erasure positions based on the erasure information coming from the convolutional decoder. If the error locator polynomial has the degree equal to or less than (2t−s)/2 or r (the number of errors) then most likely the error positions are in the current Galois-Field and the error correction and erasure algorithm is further performed. If not, set s=s+2 erasures and r=r−1 errors are assumed and again the degree of the error locator polynomial is checked and, so on until the maximum number of erasures is reached. In the case of errors only decoding, any of the known decoding algorithms can be used. In case of errors and erasures decoding, an algorithm is described herein. By not doing the entire decoding algorithm for each iteration, the increased computational complexity is easily manageable in software.

The present method can be used with an existing communication systems such as DSL, DVB-T/H, 802.11, 802.16 etc. Communication devices, for example from Sandbridge Technologies, allows an efficient software implementation of the Reed-Solomon function that provides both flexibility and low power consumption. In addition it allows correcting more than t errors. The total error and erasure correction capability is 2t.

Figure 1:
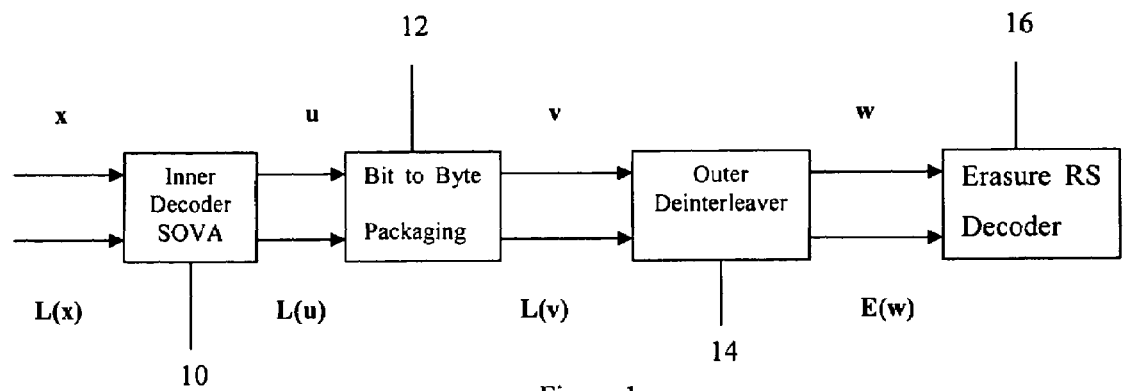
FIG. 1 is a block diagram of a Concatenated decoding system with erasure Reed-Solomon decoding according to the present disclosure.

FIG. 1 shows the block diagram for a concatenated decoding system with error/erasure decoding. The inner decoder 10 is shown as a SOVA (Soft Output Viterbi Algorithm) convolutional decoder. The SOVA decoder 10 processes the input signal stream x and its corresponding signal to noise ratio SNR estimates. The output of the SOVA 10 is the decoded information bit (hard decision) stream u and its associated log likelihood ratio reliability (soft decision, or L value) sequence L(u). u and L(u) are ran through a bit to byte packaging block 12 to generate the packed byte streams v and L(v) for outer processing. The outer deinterleaver 14 will output RS code words w and its associated erasure information E(w) for error/erasure RS decoding by outer decoder 16. The output of the outer decoder 16 is the decoded word.

Assume a convolutional code having a code rate: 1/N, there are only two branches ending in each trellis node; a constraint length: K; a memory of the code: m=K−1; and a number of trellis states: $2^m$. In classical Viterbi algorithm for the inner decoder 10, for each trellis state $S_k$, $S=0, \ldots 2^m-1$, at time instant k, compute the accumulated ML path metric:

$$\Gamma(S_{k-1}, S_k) = \Gamma(S_{k-1}) + \sum_{n=0}^{N-1} \frac{E_s}{N_o} (y_{kn} - x_{kn}^{(i)})^2, i = 1, 2$$

Where $y_{kn}$ are the $n^{th}$ output bits from the encoder if the state transitions from k−1 to k. $x_{kn}^i$ is the $n^{th}$ soft input bit on the $i^{th}$ path at time k. $E_s/N_o$ is the corresponding SNR estimate for input bit $x_{kn}^i$.

$\Gamma(S_k)=\min[\Gamma(S_{k-1}, S_k)]$ is determined, and stored with its associated survivor pre-state. In the above classical Viterbi algorithm, for two paths ending at the same node, only the information regarding the survivor path is saved. The information regarding the other path (the competing path) is discarded. SOVA looks at the path matrix difference:

$$\Delta = \max[\Gamma(S_{k-1}, S_k)] - \min[\Gamma(S_{k-1}, S_k)]$$

to make a statement about the reliability for the survivor path decision.

Figure 2:
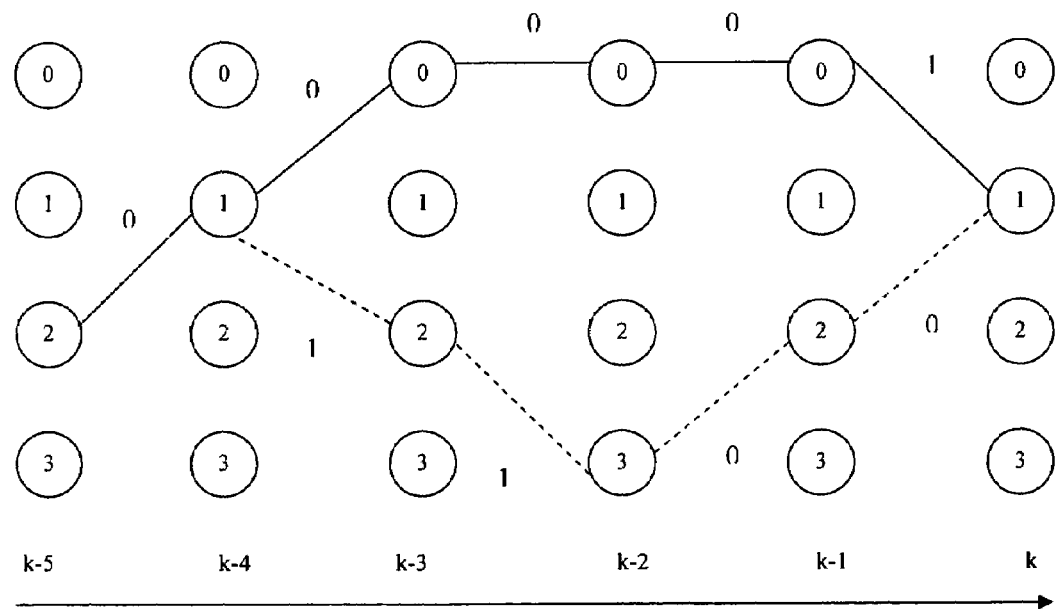
FIG. 2 is a diagram of SOVA survivor and competing path and reliability updates.

At time instant k for state $S_k$, $S=0 \ldots 2^m-1$, the reliability of selecting the right survivor path at time k for state $S_k$ can be approximated as the path metric difference $\Delta_{S_k}^k$. Each time when a survivor path is selected, the reliability values along the survivor path for the associated node needs to be updated if the survivor and competing paths yield different bit decisions on those nodes. FIG. 2 shows such an example. The survivor and competing paths will yield different bit decisions for nodes k−2 and k−3. The reliability values along the survivor path on these two nodes will need to be updated:

$$L_{S_k}^p = \min[L_{S_k}^p, \Delta_{S_k}^k], p=(k-2), \text{ and } (k-3)$$

When making decoding decisions along the final ML survivor path, the corresponding reliability values for the decoded bit will be output as the "soft" decision for further processing.

The SOVA output bit stream u and its associated reliability information stream L(u) from the inner decoder 10 will run through a bit to byte packaging process at 12 to prepare for outer RS decoding at 16. Due to the byte processing nature of RS decoding, the associated output reliability information for the packaged byte $v=[u_k, u_{k-1}, \ldots u_{k-7}]$ is $$L(v) = \min[L(u_{k-i})], i=0, 1, \ldots k-7.$$

The decoded byte stream v and its associated reliability information stream L(v) will run through the outer deinterleaving block 14 to generate the RS decoder input code word w, and its corresponding reliability information block L(w).

The Reed Solomon outer decoder 16 can correct any code word that meets the following conditions: 2r+s≦2t, where r is the number of byte errors, and s is the number of erasures in a code word. Using the RS(204, 188, t=8) shortened code in DVB-T/DVB-H system as an example, if the inner decoder 10 outputs only hard decisions and the RS decoder 16 is an error-only decoder, then s=0, and r≦8, it will only be able to correct up to eight error bytes. On the other hand, if the inner decoder 10 can provide soft decision about the reliability for the decoded bits, then it will be possible to declare erasures on error locations. Consider the most ideal situation, where all the erasures are correctly declared on the error locations:

When s=2, r≦7, the total correctable errors will be: s+r=9.
When s=4, r≦6, the total correctable errors will be: s+r=10.
When s=6, r≦5, the total correctable errors will be: s+r=11.
When s=8, r≦4, the total correctable errors will be: s+r=12.

So, it can be seen that the more erasures s are declared, the more total errors s+r will be corrected. In reality, it will be extremely difficult to declare a lot of erasures all accurately on error locations. In the present method, only s≦8 is considered.

For an RS(k,n) code, find the least reliable or smallest eight $L(w_i)$, i=0,1, . . . n−1 locations as possible candidates for erasures in the RS packet. Since error/erasure RS decoder requires more MIPs than the error-only RS decoder, an iterative decoding process is used where the first normal pass of RS decoding will be an error-only RS decoder. In most cases, when error number r is up to eight as in the example of RS(204, 188, t=8), the decoding will be successful. When the error number r is over eight, the first pass error-only decoding will fail and the RS decoder will enter an iterative decoding process where it will run RS error/erasure decoder with the errors decreasing by one and the erasures increasing by 2. The relationship between errors r and erasures s is described in the next table for the GF[256] or the equation: 2r+s=2t.

| Errors r | Erasures s |
|---|---|
| 8 | 0 |
| 7 | 2 |
| 6 | 4 |
| 5 | 6 |
| 4 | 8 |
| 3 | 10 |
| 2 | 12 |
| 1 | 14 |
| 0 | 16 |

The iterative decoding process will stop either when the RS decoding is successful or when the next RS package is ready for processing.

Figure 3:
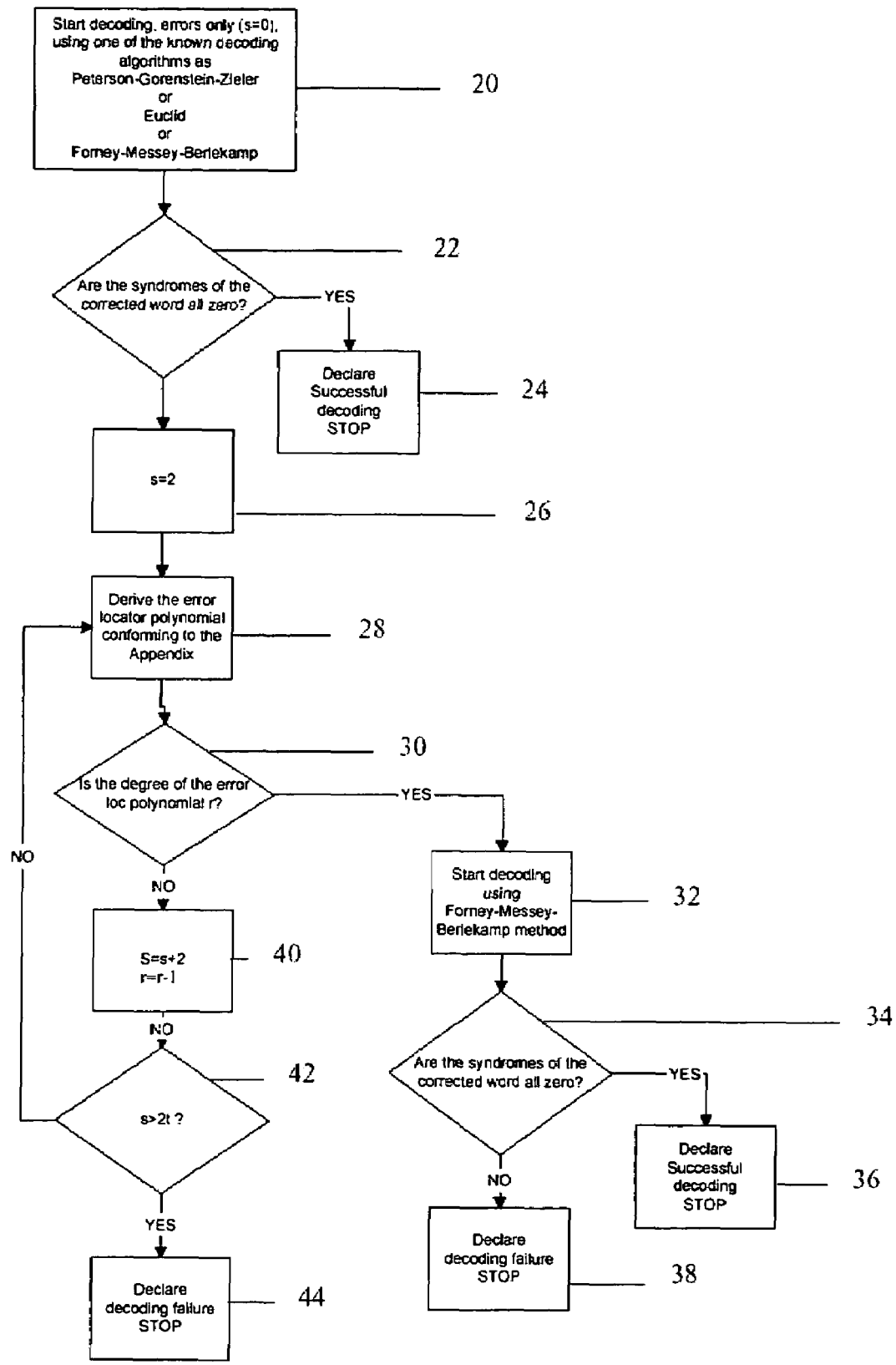
FIG. 3 is a flow chart of a Reed-Solomon decoder according the present disclosure.

FIG. 3 illustrates a flow diagram of an example of implementation of the present outer decoding process. The process begins at block 22 to start decoding with errors only. This means that the number of errors r would equal eight in the present example and the number of erasures would equal zero. This decoding would use one of the known decoding algorithms such as Peterson-Gorenstein-Zieler or Euclid or the Forney-Messey-Berlekamp. Next at 22, the syndromes of the corrected word are determined. If the syndromes of the corrected word are all zero, the error decoding only is declared successful and decoding is stopped and the corrected word is outputted at 24. If the syndromes of the corrected word are not all zero, the number of errors r is decreased by one and the number of erasure s is increased by two at 26.

The error locator polynomial is derived at 28. Next, it is determined whether the degree of the error locator polynomial is equal to or less than the decreased r at 30. If it is equal to or less than r, decode using an algorithm for example Forney-Messey-Berlekamp method for error correction and erasure decoding at 32. After the error-erasure decoding, it is determined at 34 whether the syndromes of the corrected word are all zero. If yes, the decoding is declared successful and stopped and the corrected word is outputted at 36. If the syndromes of the corrected word are not all zeros, decoding is declared a failure and stopped at 38.

If the degree of error of the locator polynomial for the reduced r is not equal to or less than the reduced r at 30, then the error r is reduced by one and the erasures S are increased by 2 at 40. It is determined at 42 whether the number of erasures S is greater than 2t. If it is not, the iterative process is restarted by determining the error locator polynomial at 28 and testing the degree at 30. If the number of erasures have maxed out at 42 than the decoding is declared a failure and is stopped at 44. The iterative process may also be stopped if the reiteration process is not completed before the arrival of the next packet. It should also be noted that the interlative decoding may be stopped before the erasures s equal 2t at 42. The optimal number of erasures s may depend upon the erasure position probability accuracy.

The particular communication code was used as an example to show the implementation of the present method. The present method is applicable to other codes and decoding.

The following description is an example of the error and erasure decoding algorithms to be implemented in the SB DVB-T/H or any other communication protocols utilizing RS $GF(2^m)$ fields. It applies for any $GF(2^m)$ field for either full length or shortened codes.

Given:
1. Valid code word $x=(x_0, x_1, \ldots, x_{n-1})$
2. Received word $r=(r_0, r_1, \ldots, r_{n-1})$
3. Generator polynomial in polynomial form:

$$g(D) = \prod_{i=0}^{2t-1} (D - \alpha^{i+j}),$$

where D stands for the variable, $\alpha^j$ is the $j^{th}$ unity root and, 2t+1 is the code minimum distance.

4. $m=(m_1, m_2, \ldots, m_t)$ is the error position vector.
5. $e=(e_{m1}, e_{m2}, \ldots, e_{mt})$ error magnitude In polynomial form, assuming that the decoder can decode t errors $$e(D) = \sum_{i=0}^{t} e_{m_i} D^{m_i}$$

The syndromes $S_i$, $0 \leq i \leq \delta-2$ $$S_i = r(D)|_{D=\alpha^{i+j}} = e(D)|_{D=\alpha^{i+j}} = \sum_{p=1}^{t} e_{m_p}(\alpha^{i+j})^{m_p}$$

The previous equation is based on $$r(D)=x(D)+e(D)=a(D)g(D)+S(D)$$

The GF Fourier transform $$X_i \sum_{k=0}^{N-1} x_k \alpha^{ik}, \text{ where } \alpha^N = 1 \text{ and } i = 0 \ldots N-1$$

or $$X_i = \sum_{k=0}^{N-1} x_k D^k \Big|_{D=\alpha^i}$$

The spectral coefficients are the evaluation of the polynomial at the roots $\alpha^i$, $i=0 \ldots N-1$. The inverse GF Fourier transform is defined as:

$$x_k = \frac{1}{N'} X(D) \Big|_{D=\alpha^{-k}}$$

In $GF(2^m)$, $N' = 1$.

For errors only decoding, error locators $L_p = \alpha^{m_p}$, where $p=1, \ldots, t$. The syndromes are:

$$S_i = \sum_{p=1}^{t} e_{m_i}(L_p)^{i+j} \text{ where } i = 0, \ldots, \delta-2$$

Define connection polynomial:

$$B(D) = \prod_{i=0}^{2t-1}(1 - L_p D) = 1 + B_1 D + \ldots + B_t D^t$$

$$B(D) = 0 \text{ for } D = L_p, p = 0, \ldots, \delta-2$$

Therefore the inverse Fourier transform of the B coefficients will yield the b coefficients with nonzero values at the error locations. Hence $b_m \cdot e_m = 0$ for $m = 0, \ldots, n-1$, and the convolution:

$$\sum_{p=0}^{t} B_p E_{i-p} = 0$$

or $$E_i = \sum_{p=1}^{t} B_p E_{i-p} \text{ where } i = 0, \ldots, n-1$$

Since $E_i \equiv S_i$, $\quad S_i = \sum_{p=1}^{t} B_p S_{i-p}$ (1)

Any solution of the system Equation (1) will lead to the error locators. As previously discussed, the decoding may be direct solving by Peterson-Gorenstein-Zierler decoding algorithm or LSFR by Massey algorithm.

For erasures and errors decoding, the error locators $L_p = \alpha^{m_p}$, where $p = 1, \ldots, r$ and the erasure locators $Z_p = \alpha^{m_p}$, where $p = 1, \ldots, s$. The correct values of code words at the error positions are $-x_{l_p}$.

Decoding procedure includes:
1. Stuff zero symbols in the $l_p$ positions.
2. Compute the syndromes $S_i$, $0 \leq i \leq \delta-2$. The syndromes will represent $\delta-1$ successive entries in the GF FT of the received sequence.

$$S_i = \sum_{p=1}^{r} e_{m_p} L_p^{i+j} + \sum_{p=1}^{s} -x_{l_p} Z_p^{i+j} i = 0, \ldots, \delta-2$$

$$S_i = E_{i+j} i = 0, \ldots, \delta-2$$

The GF FT of the incoming word:

$$E = \{E_0, E_1, \ldots, E_{i+j}, \ldots, E_{i+\delta-2,j}, \ldots, E_{n-1}\}$$
$$\underline{S_i, \ldots S_{i+j}}$$

3. Define the erasure locator polynomial $$\Lambda(D) = \prod_{i=1}^{s}(D - Z_p) = \lambda_0 D^s + \ldots + \lambda_{s-1} D^{s-1} + \lambda_s$$

4. Modify the original syndromes (Forney)

$$T_i = \sum_{p=0}^{s} \lambda_p S_{i+s-p} \text{ where, } i = 0, \ldots, \delta-s-2$$

$T_i$ are the modified syndromes and contains the error and erasure information.

5. Find $T_i$ coefficients. The error locator polynomial coefficients are obtained through the Massey shift register algorithm. First, determine the $2t-s$ T coefficients from $$T_i = \sum_{p=0}^{s} \lambda_p S_{i+s-p}$$

For this step the syndrome and erasure locator polynomials have the following form $$S(D) = S_0 + S_1 D + \ldots + S_{2t-1} D^{2t-1}$$

$$\lambda(D) = \lambda_0 + \lambda_1 D + \ldots + \lambda_s D^s$$

6. Massey algorithm:
  A. Initialize: $k=0$, $B^{(0)}(x)=1$, $L=0$ and $T(x)=x$.
  B. Loop $k=1, \ldots, 2t-s$
  C. Compute the discrepancy $$\Delta^{(k)} = T_k - \sum_{i=1}^{L} B_i^{(k-1)} T_{k-1}$$

D. If $\Delta^{(k)} = 0$ Then Go To H
  E. Modify connection polynomial $B_i^{(k)}(x) = B_i^{(k-1)}(x) - \Delta^{(k)} T(x)$
  F. If $2L \geq k$ Then Go To H
  G. $L = k-L$, $T(x) = B^{(k-1)}(x) \Delta^{(k)-1}$
  H. $T(x) = xT(x)$
7. Compute error locations by solving the $B(x)$.
8. Compute error magnitudes (Forney)

$$\frac{L_k \Omega(L_k^{-1})}{\Psi'(L_k^{-1})}$$

Where $\Omega(x) = B(x)[S(x)+1]]$ and, $\Psi'(D)$ is the formal derivative of $\Psi(D) = \Gamma(D)[S(D)+1]]$
9. Compute the erasure magnitudes $$\frac{Z_k \Omega(Z_k^{-1})}{\Psi'(Z_k^{-1})}$$

10. Correct for errors and erasures

The relationship between the total number of correctable errors and erasures is $(2t-N_L)/2 = N_z$ Although the present disclosure has been described and illustrated in detail, it is to be clearly understood that this is done by way of illustration and example only and is not to be taken by way of limitation. The scope of the present disclosure is to be limited only by the terms of the appended claims.

What is claimed is:
1. A method of decoding an encoded data stream of bits comprising:
  inner concatenated convolutional decoding the bits to produce hard decision of coded bit information and a soft decision of reliability bit information for each bit;
  deinterleaving the coded and reliability bit information; and
  outer decoding the deinterleaved coded and reliability bit information by
  a) first decoding by error correction decoding for r errors per word;

b) terminating the decoding and outputting a decoded word if the syndromes of a corrected word of the first decoding are all zeros,
c) second decoding by error correcting and erasure decoding for the number of error decreased by one and the number of erasures increased by two if the syndromes of the corrected word of the first decoding are not all zeros,
d) terminating the decoding and outputting a decoded word if the syndromes of a corrected word of the second decoding are all zeros, and
e) repeating the second decoding by error correcting and erasure decoding for the number of errors decreased by one and the number of erasures increased by two for each iteration of the second decoding if the syndromes of the corrected word of the previous second decoding are not all zeros.

2. The method according to claim 1, wherein the outer decoding is Reed-Solomon decoding.

3. The method according to claim 1, wherein the second decoding is terminated without an output if the syndromes are not all zeros for the corrected word of the second decoding by error correcting and erasure decoding for zero number of errors and 2r number of erasures.

4. The method according to claim 1, wherein the decoding is performed on packets of data.

5. The method according to claim 1, wherein the method is performed in software in a communication device.

6. A communication device including a decoder performing the method of claim 1.

7. The method according to claim 1, including:
prior to the second decoding, deriving an error locator polynomial and comparing the degree of the error locator polynomial to the decreased numbers of errors;
if the degree of the error locator polynomial is greater than the decreased numbers of errors, decreasing the number of errors by one, increase the number of erasures by two and repeating the deriving and comparing step; and
if the degree of the error locator polynomial is equal or less than the decreased numbers of errors, perform the second decoding.

8. The method according to claim 7, wherein if the degree of the error locator polynomial is equal or less than the decreased numbers of errors, terminating the decoding and outputting a decoded word if the syndromes of a corrected word of the second decoding are all zeros and terminating without an output if the syndromes are not all zeros for the corrected word of the second decoding.

9. A method of decoding an encoded data stream of bits comprising:
inner Soft Output Viterbi Algorithm decoding, the bits to produce hard decision of coded bit information and a soft decision of reliability bit information for each bit;
deinterleaving the coded and reliability bit information; and
outer decoding the deinterleaved coded and reliability bit information by
a) first decoding by error correction decoding for r errors per word;
b) terminating the decoding and outputting a decoded word if the syndromes of a corrected word of the first decoding are all zeros,
c) second decoding by error correcting and erasure decoding for the number of error decreased by one and the number of erasures increased by two if the syndromes of the corrected word of the first decoding are not all zeros,
d) terminating the decoding and outputting a decoded word if the syndromes of a corrected word of the second decoding are all zeros, and
e) repeating the second decoding by error correcting and erasure decoding for the number of errors decreased by one and the number of erasures increased by two for each iteration of the second decoding the syndromes of the corrected word of the previous second decoding are not all zeros.

10. The method according to claim 9, wherein the method is performed in software in a communication device.

11. A communication device including a decoder performing the method of claim 9.

12. A method of decoding an encoded data stream of bits comprising:
inner decoding the bits to produce hard decision of coded bit information and a soft decision of reliability bit information for each bit;
deinterleaving the coded and reliability bit information; and
outer decoding the deinterleaved coded and reliability bit information by
a) first decoding by error correction decoding for r errors per word,
b) terminating the decoding and outputting a decoded word if the syndromes of a corrected word of the first decoding are all zeros,
c) reducing the number of errors r by one and increasing the number of erasures by two if the syndromes of the corrected word of the first decoding are not all zeros,
d) deriving an error locator polynomial and comparing the degree of the error locator polynomial to the decreased numbers of errors if the syndromes of a corrected word of the first decoding are not all zeros,
e) if the degree of the error locator polynomial is greater than the decreased numbers of errors, decreasing the number of errors by one, increase the number of erasures by two and repeating the deriving and comparing step, and
f) if the degree of the error locator polynomial is equal to or less than the decreased numbers of errors, perform a second decoding by error correcting and erasure decoding.

13. The method according to claim 12, wherein if the degree of the error locator polynomial is equal or less than the decreased numbers of errors, 1) terminate the decoding and outputting a decoded word if the syndromes of a corrected word of the second decoding are all zeros and 2) terminate without an output if the syndromes are not all zeros for the corrected word of the second decoding.

14. The method according to claim 12, wherein the outer decoding is Reed-Solomon decoding.

15. The method according to claim 12, wherein the inner decoding is concatenated convolutional decoding.

16. The method according to claim 12, wherein the inner decoding is Soft Output Viterbi Algorithm decoding.

17. The method according to claim 12, wherein the decoding is performed on packets of data.

18. The method according to claim 12, wherein the method is performed in software in a communication device.

19. A communication device including a decoder performing the method of claim 12.

* * * * *